United States Patent
Kwean et al.

(10) Patent No.: US 6,897,153 B2
(45) Date of Patent: May 24, 2005

(54) ETCHING GAS COMPOSITION FOR SILICON OXIDE AND METHOD OF ETCHING SILICON OXIDE USING THE SAME

(75) Inventors: Sung-Un Kwean, Gyeonggi-do (KR); Jae-Seung Hwang, Gyeonggi-do (KR)

(73) Assignee: Samsung Electronics, Co., Ltd. (KR)

( * ) Notice: Subject to any disclaimer, the term of this patent is extended or adjusted under 35 U.S.C. 154(b) by 395 days.

(21) Appl. No.: 09/993,832

(22) Filed: Nov. 6, 2001

(65) Prior Publication Data

US 2002/0123231 A1 Sep. 5, 2002

(30) Foreign Application Priority Data

Nov. 27, 2000 (KR) .......................................... 2000-71004

(51) Int. Cl.[7] .................. H01L 21/302; H01L 21/3065; C09K 13/00; C09K 13/06
(52) U.S. Cl. ...................... 438/706; 438/710; 438/723; 252/79.1; 252/79.4
(58) Field of Search ................................ 438/706, 710, 438/723; 252/79.1, 79.4

(56) References Cited

U.S. PATENT DOCUMENTS

| | | | |
|---|---|---|---|
| 5,429,710 A | 7/1995 | Akiba et al. ................. | 438/714 |
| 6,010,968 A | 1/2000 | Yang et al. ................... | 438/719 |
| 6,291,355 B1 * | 9/2001 | Liu et al. ..................... | 438/706 |
| 6,297,163 B1 * | 10/2001 | Zhu et al. .................... | 438/707 |
| 6,319,822 B1 * | 11/2001 | Chen et al. .................. | 438/637 |
| 6,476,488 B1 * | 11/2002 | Jeng et al. ................... | 257/751 |
| 6,589,435 B1 * | 7/2003 | Okamoto et al. ............. | 216/39 |

FOREIGN PATENT DOCUMENTS

| JP | 07-335611 | 12/1995 | ....... H01L/21/3065 |
|---|---|---|---|
| JP | 11-330057 | 11/1999 | |
| JP | 11-340207 | 12/1999 | |

* cited by examiner

Primary Examiner—Duy-Vu Deo
Assistant Examiner—Lynette T. Umez-Eronini
(74) Attorney, Agent, or Firm—Mills & Onello LLP

(57) ABSTRACT

Disclosed are an etching gas composition for etching silicon oxide and a method of etching silicon oxide using the same. The etching gas composition for etching silicon oxide consists essentially of a carbon fluoride gas, in which the ratio of fluorine atoms relative to carbon atoms is less than 2, and an auxiliary fluorohydrocarbon gas comprising hydrogen, fluorine and carbon atoms. Silicon oxide is etched efficiently and precisely by utilizing a plasma of the etching gas composition. The etching selectivity of an oxide layer formed of silicon oxide with respect to photoresisit is thereby increased. Even when a thin photoresist layer wherein solubility into water changes by a light having DUV wavelength is applied, a contact hole having a high aspect ratio and a good profile can be manufactured using the etching compositions and methods of the present invention.

21 Claims, 9 Drawing Sheets

ETCHING GAS COMPOSITION FOR SILICON OXIDE AND METHOD OF ETCHING SILICON OXIDE USING THE SAME

BACKGROUND OF THE INVENTION

1. Field of the Invention

The present invention relates to an etching gas composition for etching silicon oxide and to a method of etching silicon oxide using the same, and more particularly, to an improved etching gas composition including novel combinations of components enabling the manufacture of a contact hole of a semiconductor device, said hole having a high aspect ratio and a good vertical profile, and to a method of etching silicon oxide using said improved etching gas composition.

2. Description of the Related Art

Recently, as information media such as computers have become widely spread, semiconductor devices for such specialized applications have also rapidly progressed. From a viewpoint of the function of the semiconductor device, a rapid operating velocity and a large capacity are required. In order to satisfy these requirements, manufacturing methods for semiconductor devices have been developed to improve such characteristics as integration degree, reliability, response time, etc. In order to increase the integration degree, a cell size should be reduced, and the size and margin of all of the patterns formed on a substrate also should be reduced. On the other hand, with conventional etching techniques, the aspect ratio of each member of the device (vertical size of the device with respect to the horizontal size thereof) is increased.

Accordingly, the formation of a contact hole having a high aspect ratio using conventional etching becomes gradually diverse and more difficult. Some methods and characteristics for the formation of the contact hole using conventional approaches have been reported as follows.

Japanese Patent Laid-Open No. Hei 11-330057 discloses a method of etching an oxide layer by utilizing an etching gas of $C_4F_8$ or $C_5F_8$ while adding $CH_2F_2$ and CO gas for promoting an etching reaction. According to this method, the flow rate of $C_4F_8$ or $C_5F_8$ gas is limited to a small amount in order to effectively etch a contact hole having a low ILD step and a contact hole having a high ILD step simultaneously.

U.S. Pat. No. 6,010,968 (issued to Yang et al.) discloses a method of etching a multi-layered contact hole by utilizing $Ar/CO/C_4F_8/CH_2F_2$ in a ratio of 3:4:12:80 as a plasma etching gas. Silicon nitride and silicon oxide are selectively etched by utilizing the etching gas, however, silicon or silicide is not etched.

Japanese Patent Laid-open No. Hei 11-340207 discloses a method of etching a contact hole of a nitride layer by flowing $Ar/C_4F_8/CH_2F_2$ gas within a treating bath. Through this method, a carbon film is formed at the shoulder portion of an exposed SiNx layer within the contact hole, and a deposition of carbon at the bottom portion of the contact hole is prevented. Accordingly, the damage on the SiNx film can be prevented and a contact hole having a high aspect ratio can be formed.

U.S. Pat. No. 5,429,710 discloses a method of etching a contact hole by utilizing $C_4F_8/CH_2F_2$ gas. According to this method, re-sputtering or re-deposition onto a sidewall of a contact hole of aluminum from an underlying aluminum-based material layer can be prevented during an etching of an insulating layer made of silicon compound.

Besides the above-described methods, various other etching methods for the formation of a contact hole have been reported. Research and development toward overcoming a resolution limit in order to reduce the size of CD (critical dimension) as a design rule decreases also are continuously progressing. Recently, photoresist wherein solubility with respect to an aqueous solution changes by a light having a DUV (deep ultraviolet) wavelength is becoming widely used instead of photoresist wherein solubility changes by a light having an i-line wavelength. When employing the photoresist which reacts by the light having the DUV wavelength, the resolution can be improved. However, the thickness of the photoresist should be reduced. Owing to the thin photoresist mask, a selectivity margin with respect to the photoresist is insufficient during an etching of a contact hole, resulting in a problem of a wide top CD of the contact hole occurring. This wide top CD induces an insufficient ILD margin between the contact holes or an insufficient separation between the contact holes.

FIGS. 1A & 1B are cross-sectional views of a photoresist pattern and an etched oxide layer after implementing an etching of an underlying silicon oxide layer by utilizing the photoresist pattern as a mask according to the conventional method.

Referring to FIG. 1A, a silicon oxide layer 110 is formed by depositing an oxide compound to a thickness of about 20,000–30,000 Å on a silicon substrate 100. Then, photoresist is deposited on the silicon oxide layer 110, and a common photolithography is implemented to form a photoresist pattern 122 having a CD of about 250 nm and a thickness of about 6500 Å.

Referring to FIG. 1B. a plasma enhanced dry etching is implemented by utilizing the photoresist pattern 122 as an etching mask to form an oxide layer pattern 112 having a contact hole 125 wherein the aspect ratio is about 8:1 to 12:1.

The thickness of the remaining photoresist pattern is 1000 Å or less. At the top portion of the contact hole 125, the photoresist has been lost and the CD is enlarged. It is found that the top CD of an underlying oxide layer also is enlarged as well as the photoresist pattern 122.

Owing to the phenomena of the enlargement of the top CD, a sufficient separation between adjacent contact holes cannot be accomplished, and this induces an insufficient ILD margin and defects.

In order to solve the above-described problems, a process utilizing a selectivity of a hard mask such as polysilicon, TiN, SiN, etc. has been developed. This method is designed for reducing the loss of the photoresist through forming a hard mask under the photoresist layer, the hard mask having a high etching selectivity with respect to a silicon oxide layer. Through the application of the hard mask, the loss of the photoresist can be somewhat reduced; however, additional deposition and etching steps for the hard mask complicate the manufacturing process of a semiconductor device. In addition, the improvement on the selectivity of the photoresist has a limit and so a remarkably large improvement could not be accomplished using this approach. Ultimately, an application of this method for mass production is not recommended when considering the minimal beneficial effect obtainable as compared with the additional problems of increases of particles and the number of process steps.

Another method recently developed is a polymer enhanced advance contact etching (PEACE) process. By this method, an underlying layer is etched to some degree by utilizing a photoresist pattern and, then, a polymer is deposited to form a thin polymer layer. The etching is implemented again to some degree and, then, the polymer is deposited again. This etching and deposition process is repeated to complete the etching process. After implementing the deposition of the polymer, the polymer layer formed at the bottom portion of the underlying layer is thinner than that formed at the side portion thereof. Through this characteristic, the etching characteristic of the vertical direction can be improved. However, this process must be implemented within a specific equipment. In addition, the process stability is still questionable due to an implementation of the multi-step process.

In still another method, a polymer rich process is utilized to increase the selectivity of photoresist with respect to a silicon oxide layer. This method is applicable during implementing an etching process for forming a self aligned contact (SAC) structure to prevent damage onto a shoulder portion of a spacer. By this method, polymer remains during implementing an etching process to form a contact hole in order to form a slope at the side wall of the contact hole. With this approach, too, however, some problems are generated as follows. Through this method, undesirable slope is greatly generated to induce a reactive ion etching lag (RIE-lag) phenomenon. Also, an etch stopping phenomenon also occurs through a plugging of the hole by the polymer before completing the etching to a desired depth. The RIE-lag means that an etching difference results between contact holes having different sizes when implementing the formation process of the contact hole within a wafer.\

These and other problems with and limitations of the prior art etching processes are overcome in whole or in part by the etching gas compositions and methods of the present invention.

OBJECTS AND SUMMARY OF THE INVENTION

It is a first object in the present invention to provide an etching gas composition for silicon oxide which can etch silicon oxide advantageously.

A second object of the present invention is to provide a method of etching silicon oxide by utilizing the above-mentioned etching gas composition.

A third object of the present invention is to provide a method of manufacturing a contact hole in a semiconductor device, through which a thin photoresist pattern is formed by utilizing photoresist which reacts with a light having a DUV wavelength, and then a deep contact hole can be formed at an underlying layer formed of silicon oxide by utilizing the photoresist pattern as a mask.

To accomplish the first object, there is provided in the present invention an etching gas composition for silicon oxide consisting essentially of a carbon fluoride gas in which the ratio of fluorine atoms with respect to carbon atoms is less than 2 (i.e., a compound represented as $C_xF_y$, in which y/x<2), together with an auxiliary fluorohydrocarbon gas comprising hydrogen, fluorine and carbon atoms (i.e., a compound represented as $C_kH_lF_m$, in which k, l and m represent positive integers), or, alternatively, consisting essentially of a carbon fluoride and fluorohydrocarbon, as above, in combination with carbon monoxide (CO).

The second object of the present invention is accomplished by a method of etching silicon oxide. First, an etching gas including carbon fluoride gas in which the ratio of fluorine atoms with respect to carbon atoms is less than 2 ($C_xF_y$, in which y/x<2) and an auxiliary gas including at least one atom each of hydrogen, fluorine and carbon ($C_kH_lF_m$, in which k, l and m represent positive integer) is prepared. Then, an etching process is implemented by generating a plasma of the etching gas utilizing known techniques and then applying the plasma onto silicon oxide.

The third object of the present invention is accomplished by a method of manufacturing a contact hole of a semiconductor device. A silicon oxide layer is formed by depositing silicon oxide on a semiconductor substrate, and, then, a photoresist pattern is formed as an etching mask on the silicon oxide layer. The substrate on which the photoresist pattern is formed is introduced into a reaction chamber. Then, an etching gas according to the present invention is introduced into the reaction chamber and plasma of the etching gas is generated to etch the silicon oxide layer by the generated plasma.

Particularly, the carbon fluoride gas of the etching gas composition of the present invention includes a double bond or a triple bond, and is at least one gas selected from the group consisting of $C_5F_8$, $C_4F_6$, $C_3F_4$ and $C_2F_2$.

In addition, the auxiliary gas of the etching gas composition of the present invention is at least one gas selected from the group consisting of $CH_2F_2$ and $CHF_3$, and the ratio of volumetric flow rates to the plasma chamber of the auxiliary gas with respect to the carbon fluoride gas is preferably in a range of about 0.1–3.0.

The etching gas preferably further comprises CO, and a ratio of volumetric flow rate to the plasma chamber of the CO gas with respect to the carbon fluoride gas is preferably in a range of about 1–30.

The contact hole is formed according to the above-described processes in a silicon oxide layer having a thickness in a range of about 20,000–40,000 Å. A contact hole having an aspect ratio in a range of about 8:1 to 17:1 and a diameter in a range of about 150–250 nm can thereby be advantageously formed.

In particular, the present invention is applicable for a DRAM (dynamic random access memory) device, and a preferably applicable contact hole is an MC (metal contact) hole for connecting a metal layer formed on the silicon oxide layer formed on a capacitor with an impurity doped region.

By the present invention, a novel etching gas composition is employed and a polymer rich process is utilized to form a hard polymer layer on the surface of a photoresist layer during implementing an etching process. The loss of the photoresist layer under the polymer layer is thereby minimized, and the high selectivity of the photoresist can be confirmed. In addition, the amount of polymer required during implementing the etching process is reduced thereby largely reducing a generation of an RIE-lag which might be induced by an accumulation of the polymer at the bottom or side portion of the layer being etched to accomplish the manufacture of a contact hole having a high aspect ratio.

BRIEF DESCRIPTION OF THE DRAWINGS

The above objects and advantages of the present invention will become more apparent by describing preferred embodiments in detail with reference to the attached drawings in which.

DESCRIPTION OF THE PREFERRED EMBODIMENT

The present invention will be explained in more detail with reference to the attached drawings below.

Figure 2A:
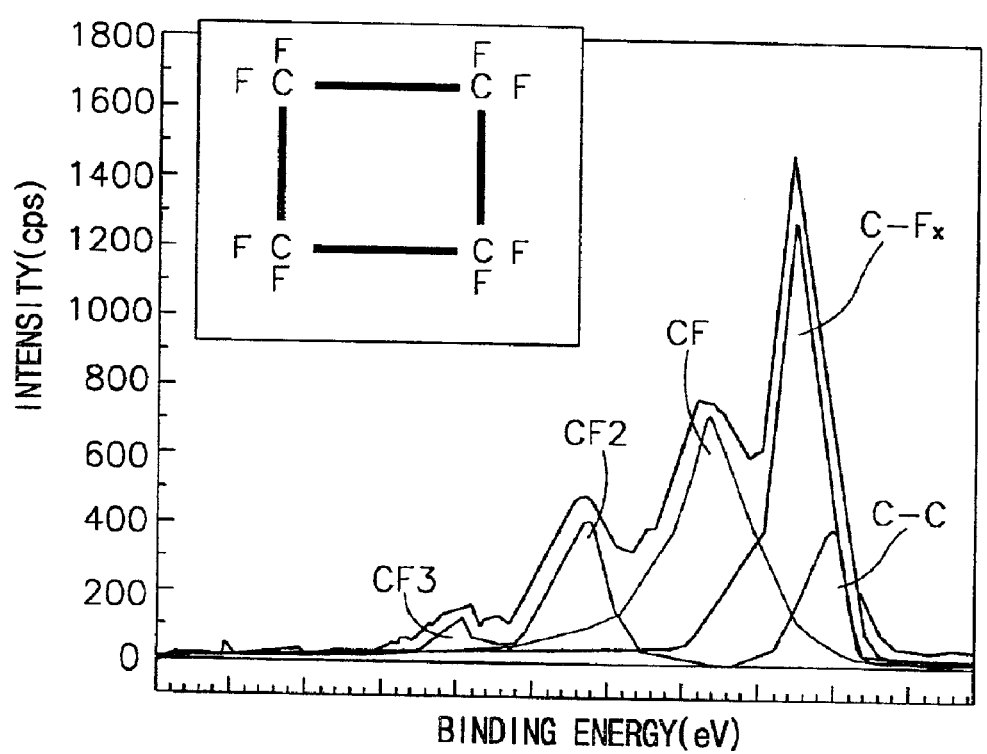
FIGS. 2A & 2B illustrate molecular structures and X-ray photoelectron spectroscopy for $C_4F_8$ and $C_5F_8$ gases.
Figure 2B:
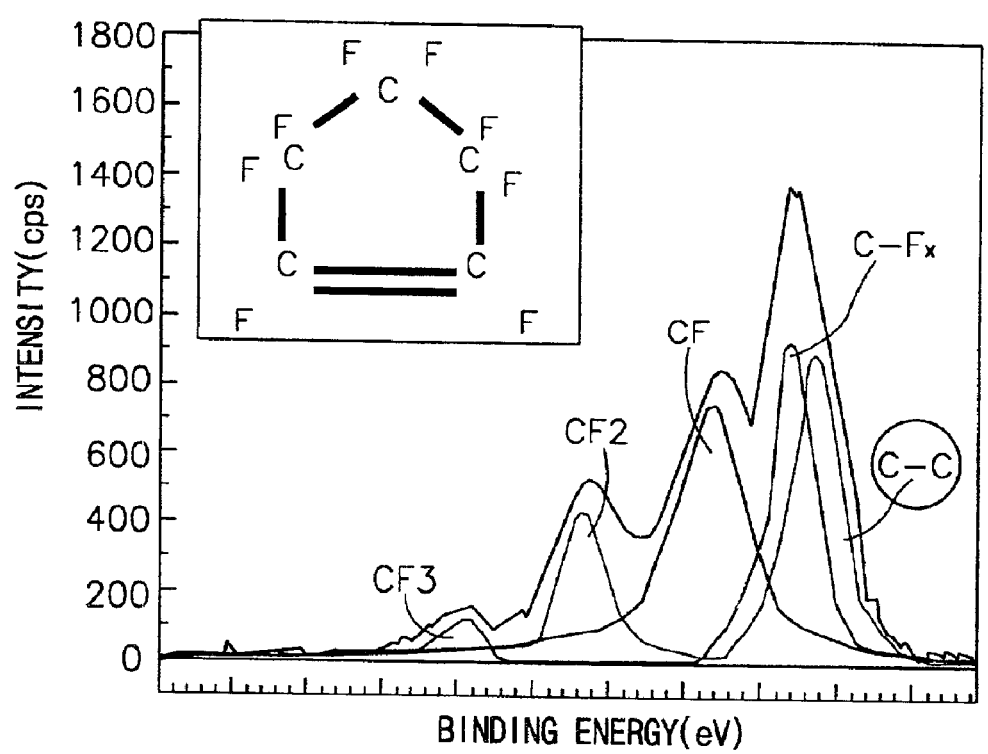

FIGS. 2A & 2B illustrate molecular structures and X-ray photoelectron spectroscopy for the gases $C_4F_8$ and $C_5F_8$. As illustrated by the molecular structure, $C_4F_8$ includes only single bonds, whereas $C_5F_8$ includes both single bonds and a double bond. Accordingly, for the $C_5F_8$ molecule, a large amount of polymer having a carbon-carbon double bond (C=C) is generated as confirmed by the spectrum illustrated in FIG. 2B. The $C_5F_8$ gas, while expensive, is desirable because it has a high selectivity onto an oxide layer to be etched with respect to the photoresist pattern formed on the oxide layer. This type of carbon fluoride gas, including the carbon double bond, is preferably employed as the carbon fluoride component of the etching gas in the present invention.

Figure 3:
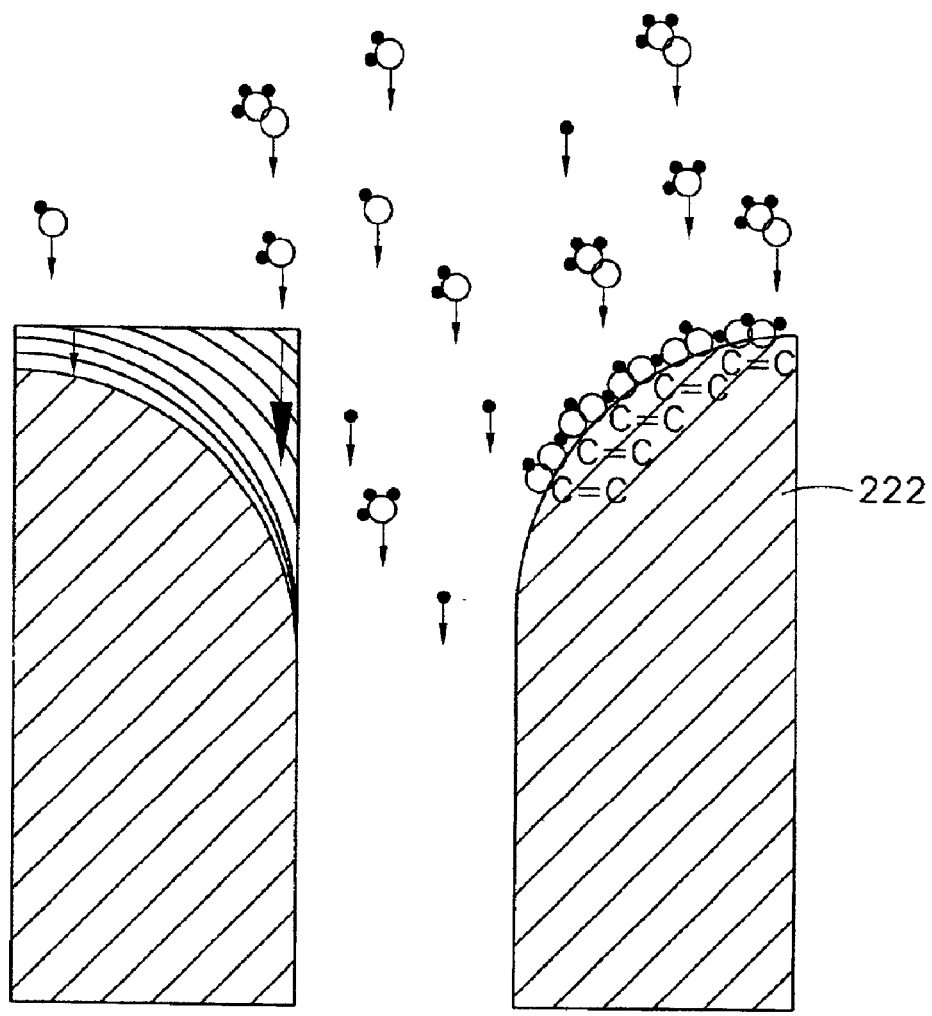
FIG. 3 schematically illustrates a reaction between $S_5F_8$ gas and a photoresist pattern during implementation of a plasma-enhanced etching of an underlying silicon oxide layer by utilizing the photoresist pattern as a mask.

FIG. 3 is a view for schematically explaining a reaction between $C_5F_8$ gas and a photoresist pattern during implementing a plasma-enhanced etching of an underlying silicon oxide layer by utilizing the photoresist pattern as a mask. From this figure, the etching behavior of an underlying oxide layer during exposure to a $C_5F_8$ plasma can be seen. A portion of the photoresist pattern having a rectangular shape is lost at the edge portion to form a rounded shape at the shoulder portion. However, a polymer layer having carbon-carbon double bonds is formed at the upper end portion of the photoresist pattern 222 through a combination of a fragment including a carbon-carbon double bond with carbon, hydrogen etc. included as a main component in the photoresist pattern. This polymer layer then demonstrates a high etching resistance with respect to the plasma etching and so could function for preventing a further loss of the photoresist pattern.

Conventionally, an etching gas continuously reacts with carbon, hydrogen, etc. included in the photoresist during implementing an etching process, resulting in a loss of a photoresist pattern. Also, the etching gas produces polymer as a by-product which rarely includes carbon-carbon double bonds. This polymer (without carbon-carbon double bonds) is accumulated at the side wall or bottom portion of a layer being etched to form an etch slope or reduce the size of a contact hole. After a time, the etching rate is lowered, which is called a "Loading Effect". Sometimes, the polymer becomes a source which acts as an etch stopping material.

In the present invention, however, due to the presence of the polymer layer which includes the carbon-carbon double bond and is formed at the upper portion of the photoresist pattern during the etching process, any further reaction of the etching gas with the photoresist components is restrained to prevent loss of the photoresist and to reduce the amount of the polymer generated. Ultimately, damage due to the accumulation of the by-products is prevented, and the etch resistance of the photoresist with respect to the silicon oxide can be substantially increased.

Figure 1A:
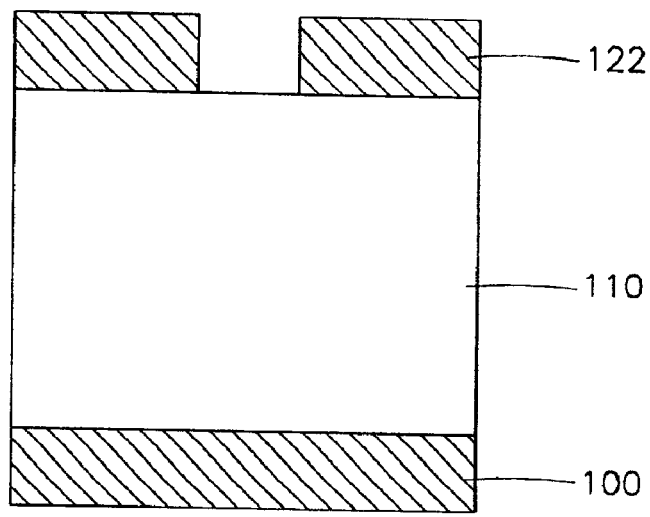
FIGS. 1A & 1B are cross-sectional views of a photoresist pattern and an etched oxide layer after implementing an etching of an underlying silicon oxide layer by utilizing the photoresist pattern as a mask according to a conventional method.
Figure 1B:
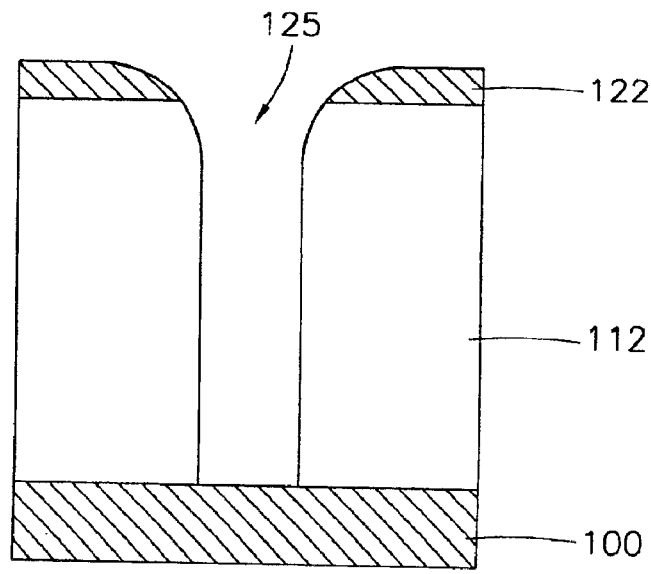
Figure 4A:
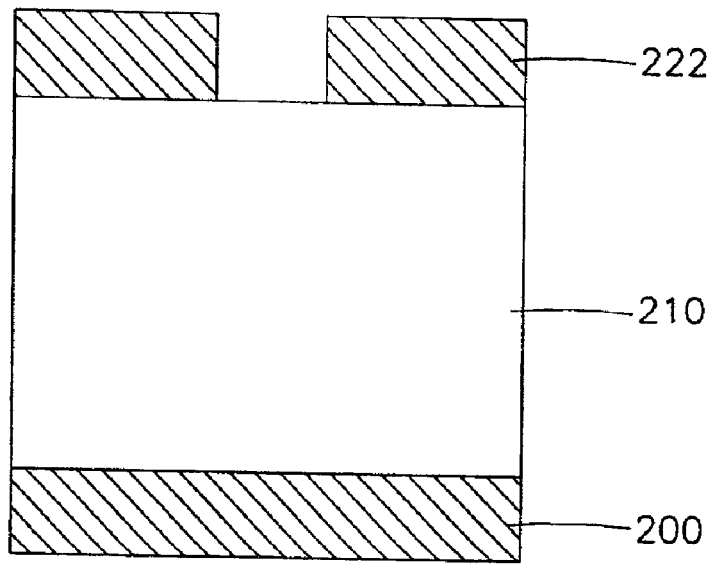
FIGS. 4A & 4B are cross-sectional views of a photoresist pattern and an etched oxide layer after implementing an etching of an underlying silicon oxide layer by utilizing the photoresist pattern as a mask according to a preferred embodiment of the present invention.
Figure 4B:
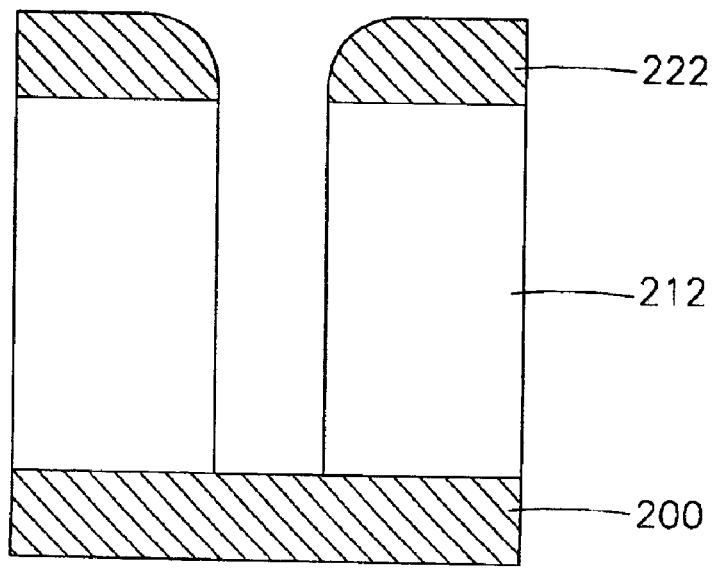

FIGS. 4A & 4B are cross-sectional views of a photoresist pattern and an etched oxide layer after implementing an etching of an underlying silicon oxide layer by utilizing the photoresist pattern as a mask according to a preferred embodiment of the present invention. For comparison with the conventional method, the layers were manufactured and etched under substantially the same conditions as illustrated in FIGS. 1A & 1B.

Referring to FIG. 4A, a silicon oxide layer 210 was formed by depositing an oxide compound to a thickness of about 20,000–30,000 Å on a silicon substrate 200. Then, photoresist was coated on the silicon oxide layer 210 and a photolithography procedure was implemented to form a photoresist pattern 222 having a CD of about 250 nm and a thickness of about 6500 Å.

Referring to FIG. 4B, a plasma enhanced dry etching procedure was implemented by utilizing the photoresist pattern 222 as an etching mask to form an oxide layer pattern 212 having a contact hole 225 having aspect ratio of about 8:1 to 12:1.

Through inspection of the thus obtained pattern, it was found that the thickness of the remaining photoresist pattern 222 is 5000 Å or more. At the top portion of the photoresist pattern 222, only a small amount of the photoresist has been lost. It was also confirmed that the top CD at the contact hole 225 formed at an underlying layer and the bottom CD of the underlying oxide layer were almost the same, in marked contrast to the pattern shown in FIG. 1B.

This result was obtained through the formation of the polymer layer having carbon-carbon double bonds at the upper portion of the photoresist layer 222 through the reaction of the etching gas with the photoresist as illustrated in FIG. 3. The polymer with carbon-carbon double bonds has a high etching resistance against the plasma, and thereby effectively prevents the loss of the photoresist and the underlying layer.

As for the auxiliary gas included in the etching gas composition of the present invention, fluorohydrocarbons such as $CH_2F_2$, $CHF_3$, etc. may be utilized to increase the selectivity of the photoresist layer with respect to the oxide layer (that is, the etching resistance of the photoresist layer with respect to the oxide layer in a predetermined etching condition). Particularly, when only $C_5F_8$ gas is utilized as the etching gas, the side wall of the contact hole may be etched to a bow shape, that is, a bowing phenomenon occurs. Accordingly, an oxide layer having a relatively deep thickness of about 40,000 Å is difficult to etch without the bowing effect occurring. The presence of the auxiliary gas according to the present invention, however, produces $CF_2$ radicals during the etching process to increase the etching rate of the oxide layer and the etching selectivity with respect to the photoresist layer. It has been found that the optimum amount of the $CF_2$ radical is at least partly dependent upon pressure, and a sufficiently large amount of the $CF_2$ radicals is typically produced within a pressure range of about 40–50 mTorr.

When considering these characteristics, the volumetric flow rate of the auxiliary gas with respect to that of the carbon fluoride gas has been found to be preferably in a range of about 0.1–3.0, and more preferably in a range of about 0.1–1.0.

Preferably, the etching gas composition may further include CO (carbon monoxide). This CO gas is regarded as a gas for producing a polymer. When the addition amount of the CO gas to the etching gas composition is excessively large, the aforementioned bowing phenomenon might occur. Accordingly, an appropriate amount of the CO gas should be added to the etching gas composition. When an appropriate amount of the CO gas is used, a reaction designated as the following equation (1) proceeds; however, when an excessive amount of the CO gas is used, a reaction designated as the following equation (2) proceeds to increase the production of oxygen.

$$CO + F \rightarrow COF_2 \quad (1)$$

$$2CO \rightarrow 2C + O_2 \quad (2)$$

Considering the above-described properties, an appropriate volumetric flow rate of the CO gas with respect to that of the carbon fluoride gas has been found to be in a range of about 1–30.

Besides the carbon fluoride, auxiliary gas, and in some embodiments, the CO components, as described above, etching gas compositions in accordance with this invention may further include basic gases (such as a carrier gas) utilized for a common dry etching process (such as $O_2$), inert gas, etc. Oxygen itself does not etch the oxide layer but can assist the etching action of the carbon fluoride gas and also functions to oxidize and remove by-products generated during the etching process. However, oxygen advantageously etches the photoresist layer, and when the amount of oxygen is too small, a slope is formed at the inner portion of the contact hole to be etched and induces an etch stopping. Considering this point, the preferred volumetric flow rate of oxygen with respect to that of the carbon fluoride gas is about 1:1. As for the inert gas, Ar, He, etc. may be used.

In the meantime, the pressure in the reaction (plasma) chamber is controlled to an appropriate degree. It has been found that if the pressure is too low, the etching action is too small and the etching proceeds too slowly. Therefore, an appropriate etching rate may not be accomplished. On the other hand, if the pressure is too high, the etching selectivity may not be controlled appropriately.

When considering the characteristics of the above-described components and the ratios between the components, a preferred etching gas composition and method in accordance with this invention includes 5–20 parts by volume of $C_5F_8$ gas, 200–500 parts by volume of Ar gas, 20–150 parts by volume of CO gas, 2–20 parts by volume of $O_2$ gas, and 2–15 parts by volume of $CH_2F_2$ gas, and wherein a pressure within the reaction chamber is maintained in a range of about 10–60 mTorr.

As described above, when a silicon oxide layer is etched by utilizing a photoresist pattern as a mask and by the method of the present invention, a contact hole is formed wherein the CD at the top portion and the CD at the bottom portion are nearly the same. This result will be described in detail with referring to preferred embodiments.

Figure 5A:
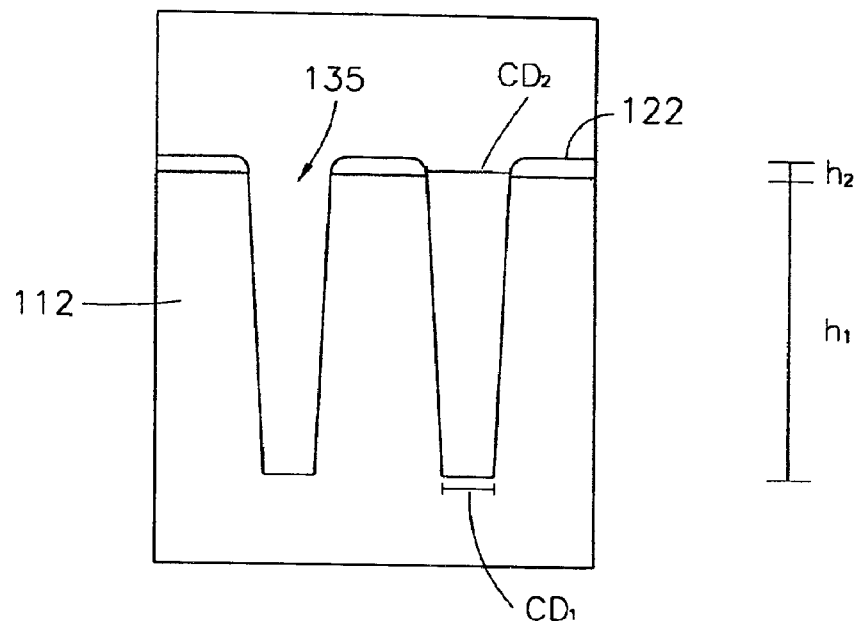
FIGS. 5A & 5B are comparison pattern profiles obtained after etching an underlying silicon oxide layer by utilizing a photoresist pattern as a mask according to the conventional method (FIG. 5A) and by utilizing a first embodiment of the present invention (FIG. 5B)
Figure 5B:
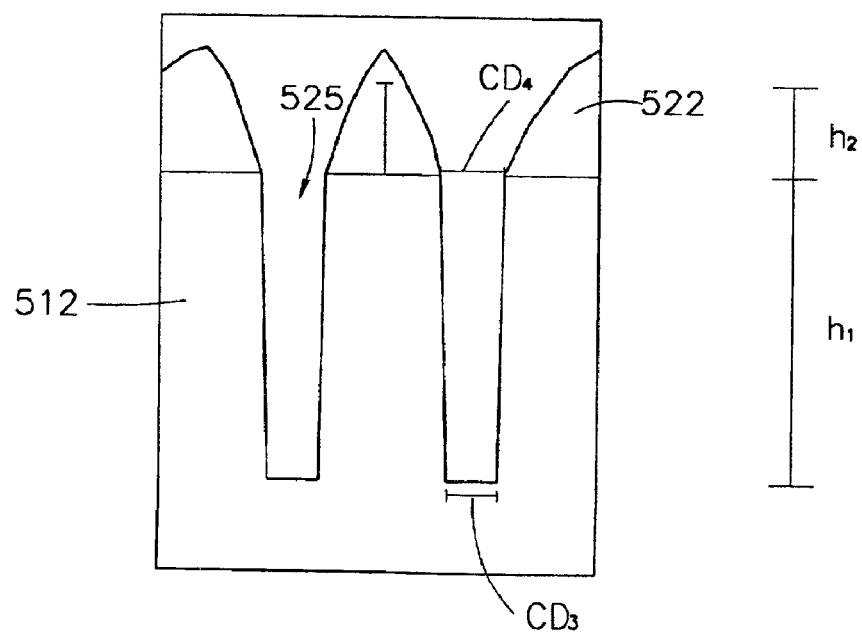

FIGS. 5A and 5B are pattern profiles obtained after etching an underlying silicon oxide layer by utilizing a photoresist pattern as a mask according to a conventional method (FIG. 5A) and according to an embodiment of the present invention (FIG. 5B). In the figures, $h_1$ is about 7640 Å, and the thickness of the photoresist pattern before ID implementing the etching process is about 3000 Å. The contact hole is BC (buried contact hole) for connecting an impurity doped region formed on a substrate with a storage node.

FIG. 5A was obtained by implementing an etching process by applying an etching gas consisting of $C_4F_8/O_2/Ar$ according to the conventional method. When inspecting a contact hole 135 formed at a silicon oxide layer 112, $CD_1$, which is the bottom CD of hole 135, is 155 nm and $CD_2$, which is the top CD of hole 135, is 210 nm. This confirmed that the top portion of the contact hole 135 was widened. The thickness of the remaining photoresist pattern 122, $h_2$ was about 500 Å or less, and it was confirmed that most of the original photoresist layer has been lost during the etching process.

FIG. 5B, by comparison, was obtained by implementing an etching process by applying an etching gas consisting of $C_5F_8/CH_2F_2/O_2/Ar/CO$ in proportions according to the present invention. When inspecting a contact hole 525 formed at a silicon oxide layer 512, $CD_4$, which is the top CD of hole 525, was 155 nm and $CD_3$, which is the bottom CD of hole 525, was 174 nm. This confirmed that the top portion of the contact hole 525 is only very slightly wider than the bottom portion, thereby resulting in a contact hole having a good (desirable) vertical profile. The thickness of the remaining photoresist pattern 522, $h_3$ was about 2650 Å, thus confirming that quite a large amount of the original photoresist layer remains.

According to the method of the present invention, the phenomenon of the undesirable widening of the top CD of the contact hole was significantly reduced and a good (desirable) vertical profile of the contact hole was obtained. Hence, the ILD margin between the contact holes is sufficient, and the separation between adjacent contact holes also was sufficient.

Figure 6:
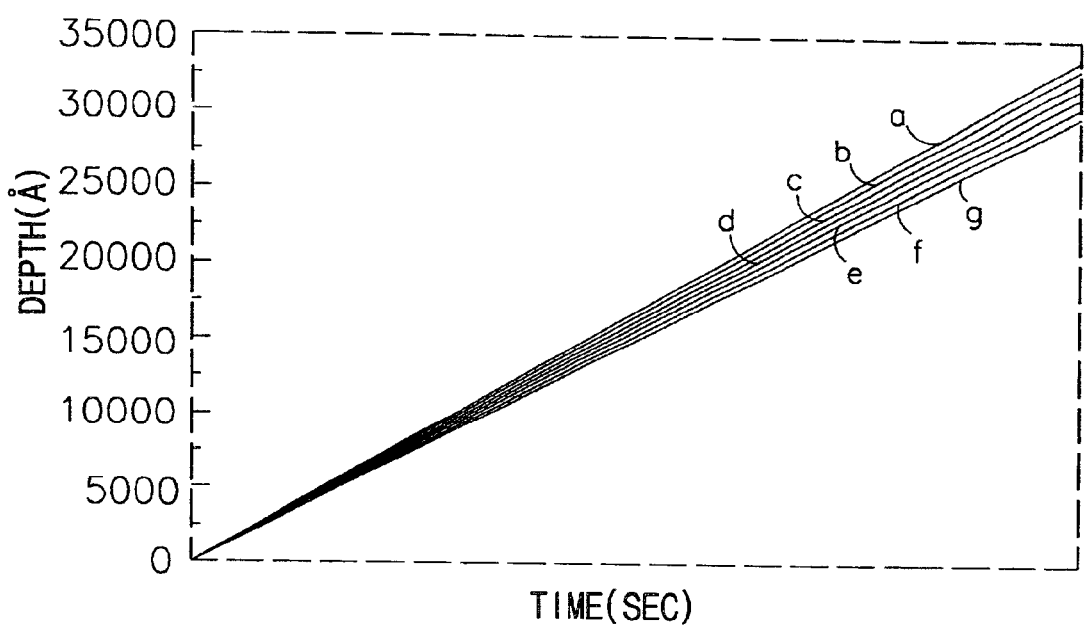
FIG. 6 illustrates graphs obtained by plotting an etched depth of a contact hole with respect to time, the contact hole being manufactured by etching an underlying silicon oxide layer by utilizing a photoresist pattern as a mask according to a second embodiment of the present invention.

FIG. 6 illustrates graphs obtained by plotting an etched depth of a contact hole with respect to time, the contact hole being manufactured by etching an underlying silicon oxide layer utilizing a photoresist pattern as a mask according to a second embodiment of the present invention. The contact hole is an MC (metal contact), which is formed for connecting a metal layer formed on a silicon oxide layer over a capacitor with an impurity doped region formed on a substrate.

When inspecting the graphs, the sizes of the contact holes were slightly different from each other. Graph a corresponds to a contact hole having a size of 432 nm, graph b to 369 nm, graph c to 349 nm, graph d to 318 nm, graph e to 277 nm, graph f to 244 nm and graph g to 202 nm. From the illustrated graphs, it was found that there was a correlation between the size of the contact hole and the depth of the contact hole. However, the differences in depths of the contact holes were not substantial. That is, the RIE-lag, which represents the difference of etching depths of contact holes having different sizes, was good, that is, the loading effect was good when etching was carried out in accordance with the present invention.

FIGS. 7A–7D are top views and cross-sectional views for contact holes manufactured by implementing a second embodiment of the present invention. For further comparison, the size, depth and aspect ratio (A/R) of the contact holes shown in FIGS. 7A–7D are illustrated in Table 1 below.

TABLE 1

Figure 7D:
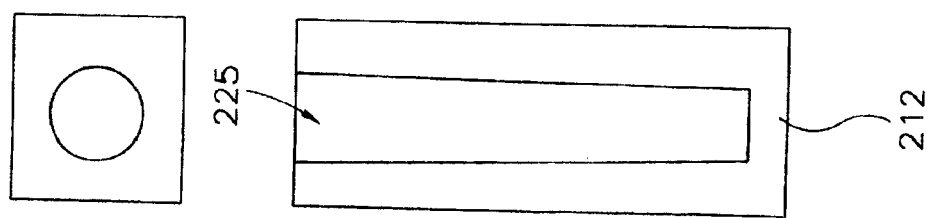
FIGS. 7A–7D are cross-sectional views and corresponding top views for contact holes manufactured by implementing a second embodiment of the present invention.
Figure 7C:
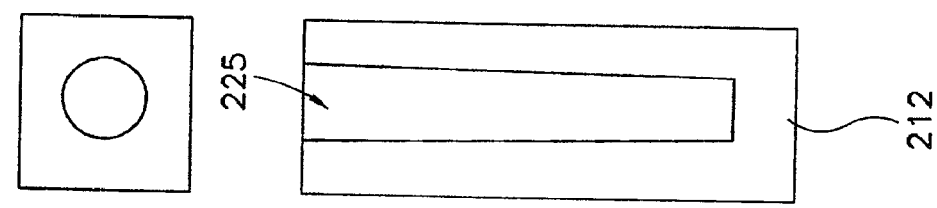
Figure 7B:
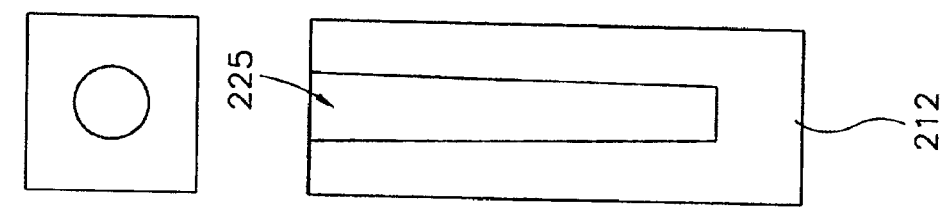
Figure 7A:
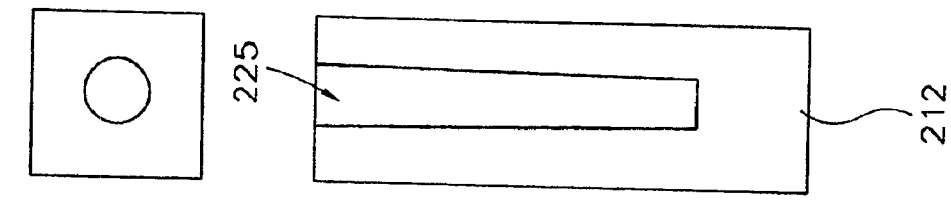

|  | FIG. 7A | FIG. 7B | FIG. 7C | FIG. 7D |
|---|---|---|---|---|
| Size (nm) | 432 | 369 | 277 | 202 |
| Depth (Å) | 34101 | 33731 | 32902 | 31675 |
| A/R | 7.9:1 | 9.1:1 | 11.9:1 | 15.7:1 |

As illustrated in Table 1, the depths of the contact holes are quite similar even though the sizes of the contact holes are different, and so the aspect ratios are also different. From the figures, it is also confirmed that a contact hole having a small size and an aspect ratio of about 8–17 also has a good profile. When manufacturing a contact hole by etching an oxide layer having a thickness of about 30,000 Å by the conventional method, the etching was carried out by two separate steps or by forming a photoresist layer having an increased thickness and forming a contact hole having a size of at least 300 nm or more.

From the results, it was confirmed that a contact hole having a diameter in a range of about 150–250 nm, a depth of about 20,000–40,000 Å, an aspect ratio of about 8:1 to 17:1 and a good profile was obtained by etching according to the present invention. As one kind of contact hole satisfying the above-described conditions, an MC (metal contact hole) for connecting a metal layer formed on a silicon oxide layer above a capacitor with an impurity doped region formed on a substrate in a DRAM device may be mentioned.

Generally, when implementing an etching process for the manufacture of a contact hole having various sizes in a wafer, the etching condition is determined to etch to a depth of a contact hole having the smallest size. Accordingly, a contact hole on the same wafer having a larger size would be exposed to an over etching condition. However, since the Loading effect is good according to the present invention, this type of defect due to over-etching can be significantly reduced. That is, since the etching condition is determined to etch a contact hole having the smallest size similar to that of a contact hole having a larger size, a slight over-etching is sufficient to complete the etching for the contact holes having various size on the same wafer.

Figure 8A:
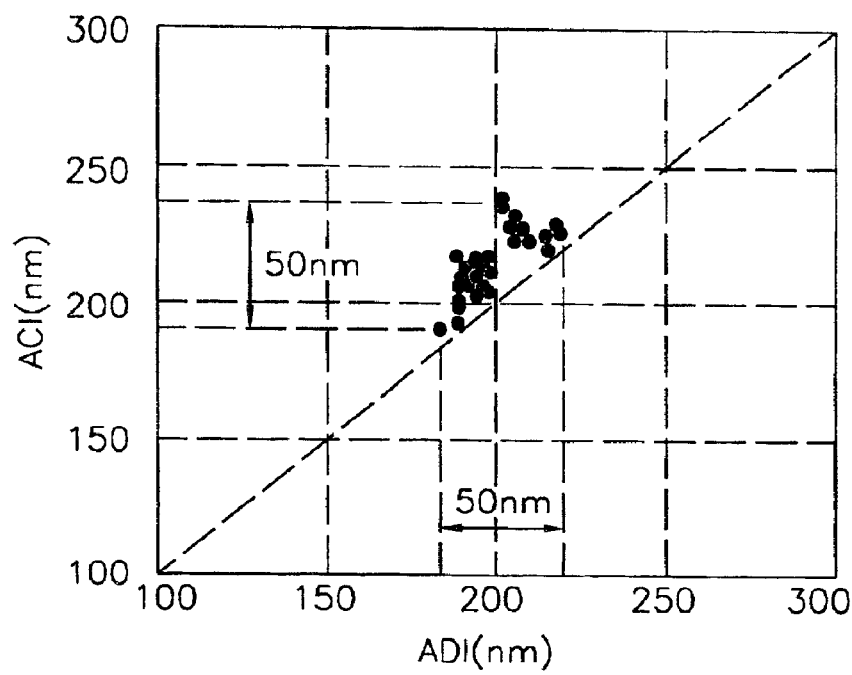
FIGS. 8A & 8B illustrate graphs obtained by comparing CD of a photoresist pattern after implementing a developing process (ADI) with the CD of an underlying silicon oxide layer after implementing an etching process (ACI) during the formation of a contact hole according to third and fourth embodiments of the present invention, in which FIG. 8A corresponds to a contact hole having a size of 220 nm and FIG. 8B corresponds to a contact hole having a size of 240 nm.
Figure 8B:
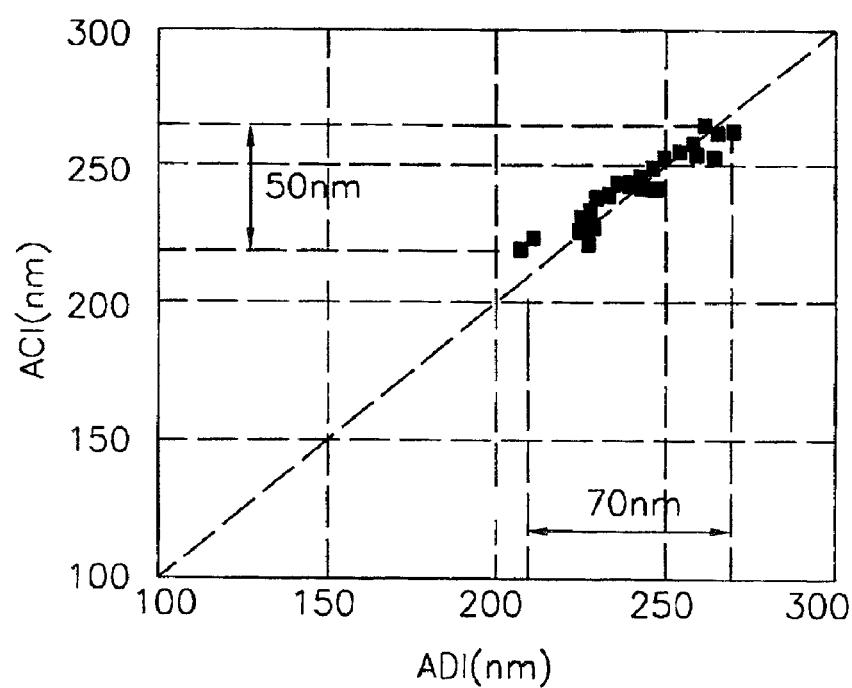

FIGS. 8A and 8B illustrate graphs obtained by comparing the CD of a photoresist pattern after implementing a developing process (ADI) and the CD of a underlying silicon oxide layer after implementing an etching process (ACI) during the formation of a contact hole according to third and fourth embodiments of the present invention, in which FIG. 8A corresponds to a contact hole having a size of 220 nm and FIG. 8B corresponds to a contact hole having a size of 240 nm. The thickness of the silicon oxide layer was about 25,000 Å. This comparison was done for measuring OCV (one chip CD variation) to confirm a transferred degree of the photoresist pattern to the underlying layer.

In FIGS. 8A and 8B, most of the plotted dots are located above the straight line in direct proportion. The interpretation of this data is that the CD of the underlying layer pattern is larger than that of the photoresist pattern. However, the differences are insignificant. Some dots are located below the straight line, and this means that the CD of the underlying layer pattern is smaller than that of the photoresist pattern. This phenomenon may be regarded as having occurred for the following reasons. Sometimes, scum from the photoresist remains on the exposed underlying layer pattern as a residue after completing the photolithography. The remaining residue functions as a mask during the etching process resulting in a smaller CD of the underlying layer pattern than that of the photoresist pattern.

The conditions of forming a contact hole according to an embodiment of the etching method of the present invention and according to the conventional etching method, and the results thus obtained, are compared below. In Table 2, a fifth embodiment of the present invention and a comparative example are illustrated. The etching conditions were applied to manufacture a contact hole for a connection of a bit line with an impurity doped region formed at a substrate. First, a bit line is formed by forming a conductive layer with a doped polysilicon and an SiN spacer. Then, an interlayer dielectric is formed on the bit line by utilizing silicon oxide such as BPSG, PSG, etc., and subsequent processes are implemented. Then, a contact hole is formed for an electrical connection of the bit line with the impurity doped region of the substrate.

In Table 2, reference symbol PR type$^{*1}$ represents photoresist, PR thickness represents a thickness measured just after coating photoresist, and PR thickness in parentheses and designated by numerals and *2 and *3 represent thicknesses of the photoresist after implementing a soft bake and a hard bake process. The etching condition designated by symbol *4 for the comparative example represents that the etching is implemented by two steps to form a contact hole having a small size. Numerals in parentheses and designated by *5 and *6 for the selectivity to PR represent selectivity at a flat area.

Particularly, the fifth embodiment according to the present invention is implemented in DRM equipment, and the flow rate of each gas component injected into the equipment is in the ratios of 11 $C_5F_8$/500 Ar/50 CO/11 $O_2$/5 $CH_2F_2$. Further, the pressure was 45 mTorr and an applied electric power was 1500 W.

TABLE 2

|  | Embodiment 5 | Comparative Example |
|---|---|---|
| PR type*1 | PR for i-line | PR for DUV |
| PR thickness (μm) | 0.87 (0.65)*2 | 1.08 (1.0)*3 |
| etching condition | 8–12 | 5.5 |
| A/R of contact hole | $C_5F_8$/Ar/CO/$O_2$/$CH_2F_2$ | $CF_4$/CO + $C_4F_8$/Ar/$O_2$*4 |
| selectivity to PR | 7:1 (20:1)*5 | 3:1 (4:1) |
| selectivity to SiN | 20:1 | 8:1 |
| selectivity to polysilicon | 50:1 | 20:1 |
| bowing size (nm) | 0–10 | 20 |
| profile angle | 89° | 87° |

As illustrated in Table 2, the selectivity of the silicon oxide layer with respect to the photoresist, and underlying SiN layer and polysilicon layer was even higher during implementing an etching process according to the present invention as compared with that of the comparative example. Accordingly, a contact hole having a small size can be advantageously manufactured using the etching gas compositions and methods of this invention. In addition, from the results of measuring the bowing size and the profile angle, it is noted that a contact hole having a good profile and a good vertical shape can be manufactured according to the present invention.

The etching gas composition of the present invention includes a carbon fluoride gas in which the ratio of fluorine atoms with respect to carbon atoms is less than 2, and an auxiliary gas including hydrogen, fluorine and carbon atoms. When mixing the components in an appropriate ratio and employing the thus obtained etching gas composition in an etching system, an etching of silicon oxide is implemented with an improved etching selectivity at an increased etching speed to remove the silicon oxide advantageously.

Accordingly, a desired shape can be obtained by etching the silicon oxide by utilizing an etching gas composition in accordance with the present invention.

In addition, by the method of manufacturing a contact hole according to the present invention, the etching selectivity of silicon oxide with respect to the photoresist can be increased to about 20:1 by employing the etching gas of $C_5F_8$. By comparison, the etching selectivity of silicon oxide with respect to the photoresist by the conventional method employing an etching gas of $C_4F_8$ was about 4:1. Accordingly, even though a thin photoresist layer wherein solubility into water is changed by a light having a DUV wavelength is applied, a contact hole having a good profile and a vertical shape can be manufactured in accordance with the present invention. The etching compositions and methods of the present invention result in a CD at the top portion of the contact hole that is almost the same as the CD at the bottom portion of the contact hole, and a sidewall bowing phenomenon is also largely reduced.

Further, an etch stopping characteristic of the present invention is good, and the RIE-lag rarely occurs even the amount of polymer produced is increased. The OCV becomes better when measuring ACI CD with respect to ADI CD, so that a contact hole having a small size can be advantageously manufactured.

While the present invention is described in detail referring to the attached embodiments, various modifications, it will be understood that alternate constructions and equivalents may be employed without departing from the true spirit and scope of the present invention.

What is claimed is:

1. A method of etching a silicon oxide layer comprising the steps of:
   (a) flowing an etching gas composition into a plasma chamber, wherein the etching gas composition consists essentially of: (i) a carbon fluoride gas of the general chemical formula $C_xF_y$, in which y/x is a ratio having a value less than 2 and which chemical formula includes at least a double or a triple carbon-carbon bond; (ii) a fluorohydrocarbon gas of the general chemical formula $C_kH_lF_m$, in which k, l and m are positive integers and wherein the volumetric flow rate of the fluorohydrocarbon gas to that of the carbon fluoride gas is a ratio having a value in a range of about 0.1 to 3.0; and (iii) oxygen, wherein the volumetric flow rate of oxygen to that of the carbon fluoride gas is a ratio having a value of about 1 to 1; and,
   (b) implementing an etching procedure by generating a plasma of said etching gas composition inside said plasma chamber, and applying said plasma onto said silicon oxide to form contact holes of substantially the same depth and with a high aspect ratio, each having top and bottom portions, wherein the top portion of each contact hole is only very slightly wider than the bottom portion.

2. A method of etching silicon oxide as claimed in claim 1 wherein said carbon fluoride gas is selected from the group consisting of $C_5F_8$, $C_4F_6$, $C_3F_4$, $C_2F_2$, and mixtures thereof.

3. A method of etching silicon oxide as claimed in claim 1 wherein said fluorohydrocarbon gas is selected from the group consisting of $CH_2F_2$, $CHF_3$, and mixtures thereof.

4. A method of etching silicon oxide as claimed in claim 1, wherein the ratio of the volumetric flow rate of the fluorohydrocarbon gas to that of the carbon fluoride gas is in a range of about 0.1 to 1.0.

5. A method of etching silicon oxide as claimed in claim 1, further wherein said etching gas composition comprises CO, and a ratio of the volumetric flow rate of said CO with respect to that of said carbon fluoride gas is in a range of about 1–30.

6. A method of manufacturing a contact hole of a semiconductor device comprising the steps of:
   forming a silicon oxide layer by depositing silicon oxide on a semiconductor substrate;
   forming a photoresist pattern as an etching mask on said silicon oxide layer;
   loading said substrate on which said photoresist pattern is formed into a reaction chamber;
   introducing an etching gas composition wherein said etching gas composition comprises about 5–20 parts by volume of $C_5F_8$ gas, about 200–500 parts by volume of Ar gas, about 20–150 parts by volume of CO gas, about 2–20 parts by volume of $O_2$ gas, and about 2–15 parts by volume of $CH_2F_2$ gas into said reaction chamber, and further wherein a pressure within said reaction chamber is maintained in a range of about 10–60 Torr; and,
   producing plasma of said etching gas composition and etching said silicon oxide layer by the produced plasma.

7. A method of manufacturing a contact hole of a semiconductor device as claimed in claim 6 wherein said photoresist is a photoresist applicable for DUV wavelength.

8. A method of manufacturing a contact hole of a semiconductor device as claimed in claim 6 wherein said contact hole has an aspect ratio having a value in a range of about 8:1 to 17:1.

9. A method of manufacturing a contact hole of a semiconductor device as claimed in claim 6 wherein a diameter of said contact hole is in a range of about 150–250 nm.

10. A method of manufacturing a contact hole of a semiconductor device as claimed in claim 6 wherein a thickness of said silicon oxide layer is in a range of about 20,000–40,000Å.

11. A method of manufacturing a contact hole of a semiconductor device as claimed in claim 6 wherein said semiconductor device is a DRAM device, and said contact hole is an MC (metal contact hole) for connecting a metal layer formed on said silicon oxide layer formed on a capacitor with an impurity doped region.

12. A method of manufacturing contact holes of a semiconductor device comprising the steps of:
   forming a silicon oxide layer by depositing silicon oxide on a semiconductor substrate;
   forming a photoresist pattern as an etching mask on said silicon oxide layer;
   loading said substrate on which said photoresist pattern is formed into a reaction chamber;
   flowing an etching gas composition into said reaction chamber, wherein the etching gas composition consists essentially of: (i) a carbon fluoride gas of the general chemical formula $C_xF_y$, in which y/x is a ratio having a value less than 2 and which chemical formula includes at least a double or a triple carbon-carbon bond; (ii) a fluorohydrocarbon gas of the general chemical formula $C_kH_lF_m$, in which k, l and m are positive integers and wherein the volumetric flow rate of the fluorohydrocarbon gas to that of the carbon fluoride gas is a ratio having a value in a range of about 0.1 to 3.0; and (iii) oxygen, wherein the volumetric flow rate of oxygen to that of the carbon fluoride gas is a ratio having a value of about 1 to 1; and, producing plasma of said etching gas composition and etching said silicon oxide layer by the produced plasma to form contact holes of substantially the same depth and with a high aspect ratio, each having top and bottom portions, wherein the top portion of each contact hole is only very slightly wider than the bottom portion.

13. A method of manufacturing a contact hole of a semiconductor device as claimed in claim 12 wherein said carbon fluoride gas is at least one member selected from the group consisting of $C_5F_8$, $C_4F_6$, $C_3F_4$ and $C_2F_2$, and mixtures thereof.

14. A method of manufacturing a contact hole of a semiconductor device as claimed in claim 12 wherein said etching gas composition further comprises CO, and a ratio of the volumetric flow rate of said CO with respect to that of said carbon fluoride gas to said reaction chamber is in a range of about 1–30.

15. A method of manufacturing a contact hole of a semiconductor device as claimed in claim 12 wherein said photoresist is a photoresist applicable for DUV wavelength.

16. A method of manufacturing a contact hole of a semiconductor device as claimed in claim 12 wherein said contact hole has an aspect ratio having a value in a range of about 8:1 to 17:1.

17. A method of manufacturing a contact hole of a semiconductor device as claimed in claim 12 wherein a diameter of said contact hole is in a range of about 150–250 nm.

18. A method of manufacturing a contact hole of a semiconductor device as claimed in claim 12 wherein a thickness of said silicon oxide layer is in a range of about 20,000–40,000 Å.

19. A method of manufacturing a contact hole of a semiconductor device as claimed in claim 12 wherein said semiconductor device is a DRAM device, and said contact hole is an MC (metal contact hole) for connecting a metal layer formed on said silicon oxide layer formed on a capacitor with an impurity doped region.

20. A method of etching a silicon oxide layer comprising the steps of:
(a) flowing an etching gas composition into a plasma chamber, wherein the etching gas composition consists essentially of: (i) a carbon fluoride gas selected from the group consisting of $C_4F_6$, $C_3F_4$, $C_2F_2$, and mixtures thereof and (ii) a fluorohydrocarbon gas of the general chemical formula $C_kH_lF_m$, in which k, l and m are positive integers and wherein the volumetric flow rate of the fluorohydrocarbon gas to that of the carbon fluoride gas is a ratio having a value in a range of about 0.1 to 3.0; and,
(b) implementing an etching procedure by generating a plasma of said etching gas composition inside said plasma chamber, and applying said plasma onto said silicon oxide to form contact holes of substantially the same depth and with a high aspect ratio, each having top and bottom portions, wherein the top portion of each contact hole is only very slightly wider than the bottom portion.

21. A method of manufacturing contact holes of a semiconductor device comprising the steps of:
forming a silicon oxide layer by depositing silicon oxide on a semiconductor substrate;
forming a photoresist pattern as an etching mask on said silicon oxide layer;
loading said substrate on which said photoresist pattern is formed into a reaction chamber;
flowing an etching gas composition into said reaction chamber, wherein the etching gas composition consists essentially of: (i) a carbon fluoride gas selected from, the group consisting of $C_4F_6$, $C_3F_4$, $C_2F_2$, and mixtures thereof; and (ii) a fluorohydrocarbon gas of the general chemical formula $C_kH_lF_m$, in which k, l and m are positive integers and wherein the volumetric flow rate of the fluorohydrocarbon gas to that of the carbon fluoride gas is a ratio having a value in a range of about 0.1 to 3.0; and,
producing plasma of said etching gas composition and etching said silicon oxide layer by the produced plasma to form contact holes of substantially the same depth and with a high aspect ratio, each having top and bottom portions, wherein the top portion of each contact hole is only very slightly wider than the bottom portion.

* * * * *

UNITED STATES PATENT AND TRADEMARK OFFICE
CERTIFICATE OF CORRECTION

PATENT NO. : 6,897,153 B2
DATED : May 24, 2005
INVENTOR(S) : Sung-Un Kwean et al.

It is certified that error appears in the above-identified patent and that said Letters Patent is hereby corrected as shown below:

<u>Column 14,</u>
Line 7, insert -- ; -- after "thereof".

Signed and Sealed this

Thirtieth Day of August, 2005

JON W. DUDAS
*Director of the United States Patent and Trademark Office*